US007615206B2

(12) United States Patent
Sandhage et al.

(10) Patent No.: US 7,615,206 B2
(45) Date of Patent: Nov. 10, 2009

(54) METHODS OF FABRICATING NANOSCALE-TO-MICROSCALE STRUCTURES

(75) Inventors: Kenneth Henry Sandhage, Atlanta, GA (US); Zhihao Bao, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 11/838,211

(22) Filed: Aug. 13, 2007

(65) Prior Publication Data

US 2008/0038170 A1    Feb. 14, 2008

Related U.S. Application Data

(60) Provisional application No. 60/837,465, filed on Aug. 11, 2006.

(51) Int. Cl.
*C01B 13/14* (2006.01)
(52) U.S. Cl. ............... 423/592.1; 423/335; 423/339; 423/325; 423/155; 423/179; 428/328; 428/407; 428/156; 428/423.1; 428/447; 516/22; 516/20; 257/9; 257/202; 438/689
(58) Field of Classification Search ............ None
See application file for complete search history.

(56) References Cited

U.S. PATENT DOCUMENTS

| 5,316,922 A | 5/1994 | Brown et al. |
| 7,067,104 B2 | 6/2006 | Sandhage |
| 2003/0044515 A1* | 3/2003 | Sandhage ............ 427/2.14 |
| 2003/0099763 A1* | 5/2003 | Sandhage ............ 427/2.14 |
| 2007/0112548 A1* | 5/2007 | Dickerson et al. ...... 703/11 |

OTHER PUBLICATIONS

Lebeau, Thierry et al., "Diatom Cultivation and Biotechnologically Relevant Products. Part I: Cultivation at Various Scales", Appl. Microbiol. Biotechnol., vol. 60, 2003, pp. 612-623.
Cha, Jennifer N. et al., "Silicatein Filaments and Subunits from a Marine Sponge Direct the Polymerization of Silica and Silicones in vitro", Proc. Natl. Acad. Sci. USA, vol. 96, Jan. 1999, pp. 361-365, Biochemistry.
Naik, Rajesh R. et al., "Peptide Templates for Nanoparticle Synthesis Derived from Polymerase Chain Reaction-Driven Phage Display", Advanced Functional Materials, vol. 14, No. 1, Jan. 2004, pp. 25-30.

(Continued)

*Primary Examiner*—Melvin C Mayes
*Assistant Examiner*—Smita Patel
(74) *Attorney, Agent, or Firm*—Ryan A. Schneider, Esq.; Troutman Sanders LLP

(57) ABSTRACT

Methods for the production of shaped nanoscale-to-microscale structures, wherein a nanoscale-to-microscale template is provided having an original chemical composition and an original shape, and the nanoscale-to-microscale template subjected to a chemical reaction, so as to partially or completely convert the nanoscale-to-microscale template into the shaped nanoscale-to-microscale structure having a chemical composition different than the original chemical composition and having substantially the same shape as the original shape, being a scaled version of the original shape. The shaped nanoscale-to-microscale structure formed comprises an element (such as silicon), a metallic alloy (such as a silicon alloy), or a non-oxide compound (such as silicon carbide or silicon nitride).

14 Claims, 7 Drawing Sheets

OTHER PUBLICATIONS

Whaley, Sandra R. et al., "Selection of Peptides with Semiconductor Binding Specificity for Directed Nanocrystal Assembly", Nature, vol. 405, Jun. 8, 2000, pp. 665-668.

Kröger, Nils et al., "Silica-Precipitating Peptides from Diatoms", The Journal of Biological Chemistry, vol. 276, No. 28, Jul. 13, 2001, pp. 26066-26070.

Dickerson, Matthew B. et al., "Identification of Peptides that Promote the Rapid Precipitation of Germania Nanopartide Networks via Use of a Peptide Display Library", Chemical Communication, 2004, pp. 1776-1777.

Sandhage, Kenneth H. et al., "Novel, Bioclastic Route to Self-Assembled, 3D, Chemically Tailored Meso/Nanostructures: Shape-Preserving Reactive Conversion of Biosilica (Diatom) Microshells", Advanced Materials, vol. 14, No. 6, Mar. 18, 2002, pp. 429-433.

Shimizu, Katsuhiko et al., "Silicatein α: Cathepsin L-like Protein in Sponge Biosilica", Proc. Natl. Acad. Sci. USA, vol. 95, May 1998, pp. 6234-6238.

Kröger, Nils et al., "Polycationic Peptides from Diatom Biosilica That Direct Silica Nanosphere Formation", Science, vol. 286, Nov. 5, 1999, pp. 1129-1132, (Including 1 Cover Page).

Naik, Rajesh R. et al., "Biomimetic Synthesis and Patterning of Silver Nanoparticles", Nature Materials, vol. 1, Nov. 2002, pp. 169-172.

Kröger, Nils et al. "Self-Assembly of Highly Phosphorylated Silaffins and Their Function in Biosilica Morphogenesis", Science, vol. 298, Oct. 18, 2002, pp. 584-586 (Including 1 Cover Page).

Kröger, Nils et al., "Species-Specific Polyamines from Diatoms Control Silica Morphology", Proc. Natl. Acad. Sci. USA, vol. 97, No. 26, Dec. 19, 2000, pp. 14133-14138.

Poulsen, Nicole et al., "Biosilica Formation in Diatoms: Characterization of Native Silaffin-2 and Its Role in Silica Morphogenesis", PNAS, vol. 100, No. 21, Oct. 14, 2003, pp. 12075-12080.

Kulp III, John L. et al., "Molecular Characterization of a Prokaryotic Polypeptide Sequence that Catalyzes Au Crystal Formation", Journal of Materials Chemistry, vol. 14, 2004, pp. 2325-2332.

Aizenberg, Joanna et al., "Calcitic Microlenses as Part of the Photoreceptor System in Brittlestars", Nature, vol. 412, Aug. 23, 2001, pp. 819-822.

Unocic, Raymond R. et al., "Anatase Assemblies from Algae: Coupling Biological Self-Assembly of 3-D Nanoparticle Structures with Synthetic Reaction Chemistry", Chemical Communication, 2004, pp. 796-797.

Thai, Corrine K. et al., "Identification and Characterization of Cu2O- and ZnO-Binding Polypeptides by Escherichia coli Cell Surface Display: Toward an Understanding of Metal Oxide Binding", Biotechnology and Bioengineering, vol. 87, No. 2, Jul. 20, 2004, pp. 129-137.

Brown, Stanley, "Metal-Recognition by Repeating Polypeptides", Nature Biotechnology, vol. 15, Mar. 1997, pp. 269-272.

Weaver, James C. et al., "Nanostructural features of Demosponge Biosilica", Journal of Structural Biology, vol. 144, 2003, pp. 271-281.

Armbrust, E. Virginia et al., "The Genome of the Diatom Thalassiosira pseudonana: Ecology, Evolution, and Metabolism", Science, vol. 306, Oct. 1, 2004, pp. 79-86 (Including 1 Cover Page).

Martin-Jézéquel, Véronique et al., "Silicon Metabolism in Diatoms: Implications for Growth", J. Phycol., vol. 36, 2000, pp. 821-840.

Holligan, P.M. et al., "Satellite and Ship Studies of Coccolithophore Production along a Continental Shelf Edge", Nature, vol. 304, Jul. 28, 1983, pp. 339-342.

Bäuerlein, Edmund, "Biomineralization of Unicellular Organisms: An Unusual Membrane Biochemistry for the Production of Inorganic Nano- and Microstructures", Angew. Chem. Int. Ed., vol. 42, No. 6, 2003, pp. 614-641.

Cai, Ye et al., "Three-Dimensional Magnesia-Based Nanocrystal Assemblies Via Low-Temperature Magnesiothermic Reaction of Diatom Microshells", Journal of the American Ceramic Society, vol. 88, No. 7, pp. 2005-2010.

Crawford, Simon A. et al., "Nanostructure of the Diatom Frustule as Revealed by Atomic Force and Scanning Electron Microscopy", J. Phycol. vol. 37, 2001, pp. 543-554.

Young, Jeremy R. et al., "Coccolith Ultrastructure and Biomineralisation", Journal of Structural Biology, vol. 126, 1999, pp. 195-215.

Mann, Stephen, "Molecular Tectonics in Biomineralization and Biomimetic Materials Chemistry", Nature, vol. 365, Oct. 7, 1993, pp. 499-505.

Werner, Dietrich, "The Biology of Diatoms", Botanical Monographs, vol. 13, 1977, Chapter 1, pp. 1-17 (Including 2 Cover Pages).

Lowenstam, H.A., et al., "Mineralization by Organisms and the Evolution of Biomineralization", Biomineralization and Biological Metal Accumulation, 1983, pp. 191-203.

Mann, D.G. et al., "Biodiversity, Biogeography and Conservation of Diatoms", Hydrobiologia, vol. 336, 1996, pp. 19-32.

Hildebrand, Mark et al., "Components and Control of Silicification in Diatoms", Progress in Molecular and Subcellular Biology, vol. 33, 2003, pp. 11-57.

Bao, Zhihao et al., "Chemical Reduction of Three-Dimensional Silica Micro-Assemblies Into Microporous Silicon Replicas", Nature, vol. 446, Mar. 8, 2007, pp. 172-175.

* cited by examiner

METHODS OF FABRICATING NANOSCALE-TO-MICROSCALE STRUCTURES

CROSS REFERENCE TO RELATED APPLICATION

This application claims priority of U.S. Provisional Patent Application No. 60/837,465, filed 11 Aug. 2006, the entire content of which is hereby incorporated by reference.

BACKGROUND OF THE INVENTION

1. Field of the Invention

The present invention relates generally to shaped three-dimensional nanoscale-to-microscale structures, and more specifically to methods of producing shaped nanoscale-to-microscale structures from nanoscale-to-microscale templates having an original chemical composition and an original shape, and subjecting the nanoscale-to-microscale templates to a chemical reaction, so as to partially or completely convert the nanoscale-to-microscale template into the shaped nanoscale-to-microscale structure having a chemical composition different than the original chemical composition and having substantially the same shape as the original shape, being a scaled version of the original shape.

2. Description of Related Art

Intensive global research and development activity is underway to develop methods for assembling nanoscale-to-microscale devices with complex shapes and fine features for a host of biomedical, telecommunications, computing, environmental, aerospace, automotive, manufacturing, energy production, chemical/petrochemical, defense, and numerous other applications. Microscale devices have already found use as sensors in automotive and some medical applications. However, a far larger untapped potential exists for the use of new three-dimensional nanoscale-to-microscale devices in a variety of advanced applications, such as in:

i) medicine (e.g., targeted drug or radiation delivery; rapid clinical and genomic analyses; in vitro sensors; micro/nanoscale surgical tools, pumps, valves, and components used in biomedical imaging, etc.), ii) transportation and energy production (e.g., new sensors and actuators for enhanced engine performance and energy utilization; micro/nanoscale components for automotive, diesel, jet, or rocket engines; micro/nanoscale components for turbines used in energy conversion or generation; micro/nanoscale reactors, pumps, bearings, etc.), iii) communications and computing (e.g., micro/nanoscale optical devices, actuators, switches, transducers, etc.), iv) environmental remediation (e.g., active micro/nanostructured filter or membrane materials for the scrubbing of gas exhausts for pollutant gases or particles or for the treatment of wastewater streams), v) agriculture (e.g., micro/nanoscale carriers for fertilizers or for delivering nutrients to animals), and vi) production/manufacturing of food, chemical, and materials (e.g., micro/nanoscale on-line sensors, reactors, pumps, dies, etc.), and a variety of consumer products (e.g., for lighting, portable electrical devices, water purification, etc.).

The widespread commercial application of three-dimensional nanostructured micro-assemblies requires processing protocols that can be scaled up for mass production on a large (up to tonnage) scale, while precisely preserving morphological features on a small (down to nanometer) scale. Developing processing protocols that satisfy both of these often-conflicting requirements of scalability and precision remains a significant challenge.

Elegant examples of large scale fabrication of three-dimensional microstructures with nanoscale features can be found in nature. Certain microorganisms are adept at assembling biomineralized structures with precise shapes and fine (submicron) features. For example, diatoms are single-celled algae that generate an exceptional variety of intricate microshells based on silicon dioxide. Each diatom microshell (a frustule) possesses a three-dimensional shape decorated with a regular pattern of fine features ($10^2$ nm pores, channels, protuberances, ridges, etc.) that are species specific; that is, the frustule shapes and fine features are under genetic control.

The frustule morphology for a given diatom species is replicated with high fidelity upon biological reproduction. Consequently, enormous numbers of identically-shaped frustules can be generated by sustained reproduction of a single parent diatom (e.g., more than 1 trillion daughter diatoms with similar frustules could be produced from a parent diatom after only 40 reproduction cycles). Such massively parallel and genetically precise three-dimensional nanoparticle assembly has no man-made analog. With tens of thousands of extant diatom species, a rich variety of frustule morphologies exists for potential device applications.

This range of diatom frustule morphologies may be further enhanced through genetic modification of diatoms. The recent mapping of the genome of the diatom *Thalassiosira pseudonana* is a first step in this direction. A number of other organisms (e.g., silicoflagellates, radiolarians, sponges, various plants, mollusks) also form controlled silica-based microstructures. Biomineralized calcium carbonate-based structures are also formed by a variety of organisms (e.g., algae, mollusks, arthropods, echinoderms, bacteria, plants). For example, coccolithophorids are micro-algae that form a rich variety of intricate three-dimensional calcium carbonate-based microshells.

While a wide variety of shapes and fine features can be found among the various biomineralized structures, the natural chemistries of such structures are largely based on calcium compounds (carbonates, phosphates, oxalates, halides) or silica. Such limited chemistries severely restrict the properties (e.g., electronic, biomedical, chemical/catalytic, optical, thermal) of such micro/nanostructures for device applications. If such micro/nanostructures could be converted into a much wider range of chemistries, without a loss of the biologically-derived shapes or fine features, then the massively parallel and genetically precise three-dimensional self-assembly characteristics of nature could be synergistically coupled with such chemical tailoring to enable the mass production of enormous numbers of nanoscale-to-microscale devices with a diverse range of properties for numerous applications.

Recent work has shown how gas/solid displacement reactions of the following type may be used to convert silica diatom microshells into non-silica-based compositions without a loss of the starting microshell shapes and fine features:

$$2Mg(g) + SiO_2(s) \Rightarrow 2MgO(s) + \{Si\} \quad (1)$$

where {Si} refers to a Si-bearing product. The shapes and fine features of the starting diatom microshells were well preserved in the MgO-based microshell replicas. Other oxidation-reduction reactions may be used to generate a wide variety of oxide/metal composite replicas.

For example, U.S. Pat. No. 7,067,1041 discloses beneficial methods of producing shaped microcomponents from biologically-derived silica microtemplates, namely diatom microshells, wherein the microshells are converted into microtemplates comprising solid oxides.

Yet, it would be more beneficial to provide a more general fabrication method not so limited to biological microtemplates/diatom silica microshells.

It further would be beneficial to provide production methods for microcomponents that are not limited to comprising of oxides, such that nanoscale-to-microscale devices can be fabricated that are formed of elements, alloys of elements, or non-oxides such as carbides.

Work to date has not demonstrated, however, how nanostructured micro-assemblies (such as diatom microshells) may be reactively converted into inorganic replicas comprised solely of an element (such as silicon), a metallic alloy (such as a silicon alloy), or a non-oxide compound (such as silicon carbide or silicon nitride). Nanocrystalline silicon-based devices, for example, can exhibit attractive electronic or optical properties (e.g., photoluminescence). Nanocrystalline silicon carbide-based devices and silicon nitride-based devices can exhibit attractive electronic, chemical, and mechanical properties (e.g., high strength).

Thus, it is a provision of the present invention to provide a more general fabrication process than that conventionally known, including the ability to fabricate nanoscale-to-microscale devices beyond those fabricated only from biological microtemplates/diatom silica microshells, and where such devices are formed from the syntheses of non-oxide bearing products. It is to such a method that the present invention is primarily directed.

BRIEF SUMMARY OF THE INVENTION

Briefly described, in preferred form, the present invention provides methods for the production of shaped nanoscale-to-microscale structures, wherein a nanoscale-to-microscale template is provided having an original chemical composition and an original shape, and the nanoscale-to-microscale template subjected to a chemical reaction, so as to partially or completely convert the nanoscale-to-microscale template into the shaped nanoscale-to-microscale structure having a chemical composition different than the original chemical composition and having substantially the same shape as the original shape, being a scaled version of the original shape. The scale of the structure can vary in a range from smaller than the template to larger than the template, including have a scale of one (1) being the same shape and size of the template.

Preferably, the shaped nanoscale-to-microscale structure formed comprises an element (such as silicon), a metallic alloy (such as a silicon alloy), or a non-oxide compound (such as silicon carbide or silicon nitride).

It will be understood by those of skill in the art that the nanoscale-to-microscale templates and structures of the present invention are on the scale of sizes of less than 1000µ, more preferably less than 100µ, even more preferably less than 10µ, even more preferably on the order of 100 nm or smaller in size The nanoscale-to-microscale template can be a biologically-derived nanoscale-to-microscale template, either being a naturally-occurring nanoscale-to-microscale template, or a synthetic (man-made) template.

The chemical reaction of the present invention can be a displacement reaction that yields at least two condensed phase reaction products, wherein at least a part of at least one of the condensed phase reaction products can be selectively removed from the reacted shaped nanoscale-to-microscale template to yield the nanoscale-to-microscale structure.

As will be understood by those of skill in the art, the nanoscale-to-microscale structure is in essence a replica of the nanoscale-to-microscale template, and thus the nanoscale-to-microscale structure may herein also be referred to as the nanoscale-to-microscale replica.

The present invention can further comprise methods for converting shaped nanoscale-to-microscale silica-bearing templates into replicas comprised of nanostructured silicon or a nanostructured non-oxide silicon-bearing compound (such as silicon carbide, silicon nitride, or a silicide compound) or a nanostructured silicon-bearing solid solution. The present invention provides shaped nanoscale-to-microscale structures comprised of nanostructured silicon or a nanostructured non-oxide silicon-bearing compound (such as silicon carbide, silicon nitride, or a silicide compound) or a nanostructured silicon-bearing solid solution.

The present invention can include two or more chemical reactions to produce the structure from the template. In such a process, the original nanoscale-to-microscale template undergoes a first chemical reaction, and forms, among other things, an intermediate template. That intermediate template then undergoes a second chemical reaction, to form the final structure. In such an embodiment, the chemical composition of the original nanoscale-to-microscale template is preferably different than the chemical composition of the intermediate template, and the chemical composition of the intermediate template is preferably different than the chemical composition of the final structure. In one embodiment, the intermediate template and the final structure comprise non-oxides, but they are different non-oxides.

The present invention provides methods for converting shaped nanoscale-to-microscale three-dimensional silica-bearing templates into three-dimensional replicas comprised of nanostructured silicon or a nanostructured non-oxide silicon-bearing compound (such as silicon carbide, silicon nitride, or a silicide compound) or a nanostructured silicon-bearing solid solution. The present invention provides shaped nanoscale-to-microscale three-dimensional structures comprised of nanostructured silicon or a nanostructured non-oxide silicon-bearing compound (such as silicon carbide, silicon nitride, or a silicide compound) or a nanostructured silicon-bearing solid solution.

The present invention provides methods for converting shaped nanoscale-to-microscale silica-bearing templates into devices comprised of nanostructured silicon or a nanostructured non-oxide silicon-bearing compound (such as silicon carbide, silicon nitride, or a silicide compound) or a nanostructured silicon-bearing solid solution. The present invention provides devices comprised of nanostructured silicon or a nanostructured non-oxide silicon-bearing compound (such as silicon carbide, silicon nitride, or a silicide compound) or a nanostructured silicon-bearing solid solution.

The present invention provides methods for converting shaped nanoscale-to-microscale three-dimensional silica-bearing templates into three-dimensional devices comprised of nanostructured silicon or a nanostructured non-oxide silicon-bearing compound (such as silicon carbide, silicon nitride, or a silicide compound) or a nanostructured silicon-bearing solid solution. The present invention provides shaped nanoscale-to-microscale three-dimensional devices comprised of nanostructured silicon or a nanostructured non-oxide silicon-bearing compound (such as silicon carbide, silicon nitride, or a silicide compound) or a nanostructured silicon-bearing solid solution.

The present invention provides methods for converting shaped nanoscale-to-microscale templates into replicas comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy). The present invention provides shaped nanoscale-to-microscale structures comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy).

The present invention provides methods for converting shaped nanoscale-to-microscale three-dimensional templates into three-dimensional replicas comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy). The present invention provides shaped nanoscale-to-microscale three-dimensional structures comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy).

The present invention provides methods for converting shaped nanoscale-to-microscale templates into devices comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy). The present invention provides devices comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy).

The present invention provides methods for converting shaped nanoscale-to-microscale three-dimensional templates into three-dimensional devices comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy). The present invention provides three-dimensional devices comprised of a nanostructured element or a nanostructured intermetallic compound (such as a silicide or aluminide) or a nanostructured non-oxide ceramic compound (such as a carbide, nitride, boride, or sulfide) or a nanostructured metallic solid solution (such as a silicon alloy).

The present invention particularly provides attractive means of producing freestanding nanostructured micro-assemblies of silicon, silicon solid solutions, silicides, silicon carbide, or silicon nitride for use in electronic, optical, chemical, or mechanical applications. Nanostructured silicon-based devices can exhibit attractive electronic or optical properties (e.g., photoluminescence). Nanostructured silicon carbide-based devices and silicon nitride-based devices can exhibit attractive electronic, chemical, and/or mechanical properties (e.g., high strength).

The present invention further comprises a low-temperature, for example, approximately 650° C., magnesiothermic reduction process for converting three-dimensional nanostructured silica micro-assemblies into microporous nanocrystalline silicon replicas.

The present invention provides nanoscale-to-microscale structures and nanoscale-to-microscale devices for a variety of uses, including telecommunications, computing, biomedical, agricultural, environmental, aerospace, automotive, manufacturing, chemical/petrochemical, energy production, and defense applications.

These and other objects, features and advantages of the present invention will become more apparent upon reading the following specification in conjunction with the accompanying drawings.

BRIEF DESCRIPTION OF THE FIGURES

FIGS. 1A-1B are secondary electron images of: FIG. 1A—half of an *Aulacoseira* diatom microshell, and FIG. 1B—a complete *Aulacoseira* microshell.

FIGS. 3A-3B are secondary electron images of: FIG. 3A—a Si replica of half of an *Aulacoseira* diatom, and FIG. 1B—a Si replica of a complete *Aulacoseira* microshell.

FIG. 7A—Secondary electron (SE) image of an *Aulacoseira* silica diatom frustule. FIG. 7B—SE image of a MgO/Si composite replica after reaction of an *Aulacoseira* frustule with Mg(g) at 650° C. for 2.5 hours. FIG. 7C—SE image of a Si-bearing replica produced by selective dissolution of MgO from a MgO/Si replica in a HCl solution. FIG. 7D—SE image of a Si replica after the HCl treatment and an additional treatment in a HF solution.

FIGS. 8A-8B illustrate phase content of diatom frustules after magnesiothermic reduction. FIG. 8A—X-ray diffraction pattern revealing the presence of magnesia (MgO) and silicon formed after exposure of *Aulacoseira* silica diatom frustules to magnesium gas at 650° C. for 2.5 hours. FIG. 8B—X-ray diffraction pattern obtained after selective dissolution of the MgO from the MgO/Si composites in FIG. 8A.

FIGS. 9A and 9B—Low and higher magnification transmission electron images, respectively, of an ion-milled cross-section of a Si frustule replica. FIG. 9C—High resolution transmission electron image of adjacent Si nanocrystallites. FIG. 9D—The same image in FIG. 9C after Fourier filtering. FIG. 9E—Selected area electron pattern obtained from the Si frustule replica shown in FIGS. 9A and 9B.

DETAILED DESCRIPTION OF THE PREFERRED EMBODIMENTS

Figure 1:
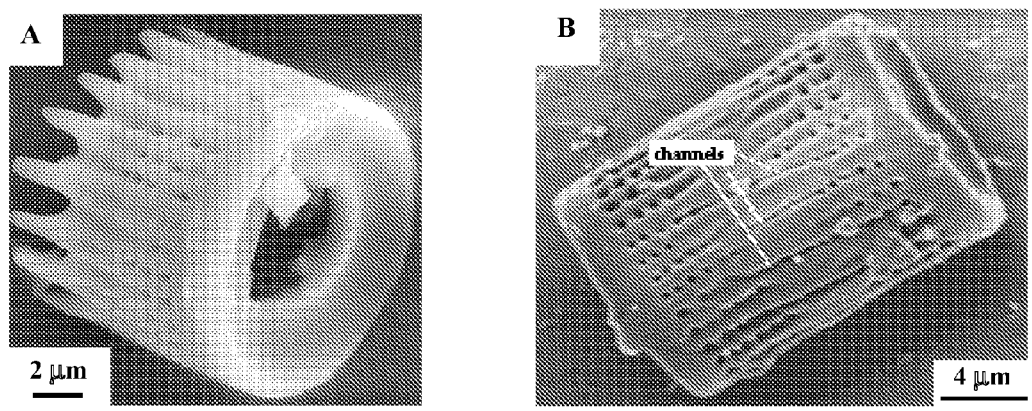

The present invention provides the following general method for converting shaped nanoscale-to-microscale templates into nanoscale-to-microscale replicas:

prepare or obtain a shaped nanoscale-to-microscale template with a desired shape and/or fine features that is comprised, partially or entirely, of a reactant compound, allow the shaped nanoscale-to-microscale template to undergo a displacement reaction that yields at least two condensed phase reaction products, and selectively remove all or part of at least one of the condensed phase reaction products from the reacted shaped nanoscale-to-microscale template to yield a nanoscale-to-microscale replica, having substantially the same size and/or at least one dimensional feature as the starting shaped nanoscale-to-microscale template.

After these steps, the nanoscale-to-microscale replica includes at least one remaining reaction product of different composition than the reactant compound, and the at least one remaining reaction product is a single element, a mixture of elements, a metallic solid solution, an intermetallic compound, a non-oxide compound, or a mixture thereof.

In another preferred embodiment, the present invention comprises an additional step, wherein the nanoscale-to-microscale replica undergo further reaction to form a new element, a new mixture of elements, a new metallic solid solution, a new intermetallic compound, a new non-oxide compound, or a mixture thereof.

The Shaped Nanoscale-To-Microscale Template

The shaped nanoscale-to-microscale template may be prepared in a variety of ways or obtained from a variety of sources. For example, the shaped template may be assembled by a natural biological organism or an environmentally-modified biological organism or a genetically-modified biological organism. The biologically-assembled shaped nanoscale-to-microscale template may possess a desired shape and/or desired fine features. The fine features may be selected from the group including, but not limited to, pores, channels, nodules, ridges, protuberances, or combinations thereof. The nanoscale-to-microscale template generated by the biological organism may be a hard or soft endoskeleton, a portion of a hard or soft endoskeleton, a hard or soft exoskeleton, or a portion of a hard or soft exoskeleton, generated by, or comprising part of, a once-living organism. The template may be generated by organisms selected from the group including, but not limited to, biological kingdoms that includes Monera, Protoctista, Fungi, Animalia, and Plantae. The template may be generated by organisms selected from the group of phyla that includes, but is not limited to, Monera, Dinoflagellata, Haptophyta, Bacillariophyta, Phaeophyta, Rhodophyta, Chlorophyta, Zygnematophyta, Chrysophyta, Rhizopodea, Siphonophyta, Charophyta, Heliozoata, Radiolariata, Foraminifera, Mixomycota, Ciliophora, Basidiomycota, Deuteramycota, Coelenterata, Mycophycophyta, Bryophyta, Tracheophyta, Porifera, Cnidaria, Platyhelminthes, Ectoprocta, Brachiopoda, Annelida, Mollusca, Arthropoda, Sipuncula, Echinodermata, and Chordata. Examples of naturally-occurring templates include, but are not limited to, the silica-based microshells of diatoms, silicoflagellates, radiolarians, and sponges; the calcium carbonate-based microshells of mollusks, coccolithophorids, and echinoderms; and the iron-bearing magnetic crystals generated by magnetotactic bacteria. The template may be generated by an organism that is genetically modified so as to generate a template with a shape, fine features, or a combination thereof that differ from the template generated by the native (non-genetically-modified) organism. The template may be generated by an organism that is exposed to conditions that differ from the ambient environment where the living organism is found, so that the organism is induced to generate a template with a shape, fine features, or a combination thereof that differ from the template generated by the native organism in the ambient environment.

The shaped nanoscale-to-microscale template may be synthesized through the use of a component of a microshell-forming organism. The component of a microshell-forming organism may be selected from the group including, but not limited to, one or more organelles within a cell or cells, one or more nucleotides, one or more proteins, one or more polypeptides, one or more polyamines, and one or more polysaccharides.

The nanoscale-to-microscale template may have a shape or fine features that are generated with the use of a biological molecule, or from a portion of a biological molecule, or from a chemically-modified biomolecule, or from a portion of a chemically-modified biomolecule.

As used herein, the terms "biological molecule" or "biomolecule" refer to any molecule that is derived from a native biological organism or a biological organism that has been environmentally modified or genetically modified, from a component of a native or environmentally-modified or genetically-modified biological organism, or from an agent that utilizes a native or environmentally-modified or genetically-modified biological organism to multiply.

The nanoscale-to-microscale template generated with the use of a biological molecule may have a shape or fine features that are obtained by synthetic patterning. Once patterned, the biomolecule may induce the precipitation of a nanoscale-to-microscale template that assumes the shape of the patterned biomolecule. For example, a polypeptide that promotes the formation of silica in a diatom (a silaffin) may be patterned into a desired shape and then exposed to a silicon-bearing precursor (e.g., silicic acid) solution to form a patterned silica template. A silaffin, or a portion of a silaffin, may be patterned via controlled deposition onto an inert substrate. The silaffin may be patterned via a method including, but not limited to, controlled phase separation from a silaffin-bearing solution, direct writing with a tip coated with the silaffin, and printing of the silaffin with an ink jet printer. The patterned silaffin, or patterned portion of a silaffin, may then be exposed to a silicic acid solution so as to precipitate a silica template with the same pattern at that of the silaffin.

The shaped nanoscale-to-microscale template may be synthesized through the use of a non-naturally-occurring molecule, such as a non-naturally-occurring polypeptide. For example, a non-natural polypeptide, identified through the use of a phage display library approach, may be patterned into a desired shape and then used to promote the formation of a shaped mineralized microtemplate.

The shaped nanoscale-to-microscale template may be prepared through the use of conventional top-down microfabrication methods. For example, a micropatterned silicon structure could be produced by photolithography and then oxidized to yield a patterned silica structure as the shaped template. The shaping of a silicon template could also be accomplished through the use of reactive ion etching, sputtering, or laser ablation.

The shaped nanoscale-to-microscale template may be prepared by a coating method. For example, a biologically-formed microshell could be coated with a conformal layer of silica. The silica coating could be applied, for example, by physical vapor deposition, chemical vapor deposition (such as by atomic layer deposition), sol-gel deposition, or dip coating of the microshell into a solution containing a silica precursor (e.g., a silicon salt or silicon-bearing molecule). After coating the microshell, the microshell may be selectively removed (such as by selective dissolution) to yield a coating-based replica of the microshell as the shape nanoscale-to-microscale template.

The shaped nanoscale-to-microscale template may be prepared by the assembly of colloidal particles. The colloidal particles may be assembled under the influence of agents in a solution (e.g., surfactants, coagulants, etc.) and/or under the influence of external forces (e.g., electromagnetic, capillary, or other mechanical forces).

The shaped nanoscale-to-microscale template may be prepared through the use of a solid freeform fabrication method. For example, three-dimensional printing of nanoscale powder particles into a microscale template may be conducted with the use of an ink-jet printer.

The shaped nanoscale-to-microscale template may be prepared by the deposition of particles, by the solidification of a liquid precursor, or by the condensation of a gas precursor into patterned cavities on a substrate. For example, a pattern of cavities could be produced on a silicon substrate (e.g., by photolithography) and the cavities could then be filled with silica via chemical vapor deposition with a silicon-bearing precursor gas.

Composition of the Nanoscale-To-Microscale Templates

The reactant compound comprising all or part of the shaped nanoscale-to-microscale template could be selected from the group including, but not limited to, an oxide compound, a nitride compound, a carbide compound, a carbonate compound, a boride compound, a sulfide compound, a sulfate compound, a phosphide compound, a phosphate compound, an oxalate compound, a citrate compound, a halide compound, a silicide compound, or an aluminide compound, or a mixture or solid solution of two or more of these compounds.

The reactant compound comprising all or part of the shaped nanoscale-to-microscale template could be selected from the group including, but not limited to, calcite, aragonite, vaterite, monohydrocalcite, protodolomite, amorphous carbonates, amorphous hydrous carbonates, dahllite, francolite, huntite, brushite, octocalcium phosphate, calcium pyrophosphate, hydroxyapatite, calcium magnesium phosphates, whitlockite, amorphous dahllite precursor, amorphous brushite precursor, amorphous whitlockite precursor, amorphous hydrated ferric phosphate, amorphous iron calcium phosphate, fluorite, amorphous fluorite precursor, whewellite, weddelite, glushinskite, calcium citrate, gypsum, celestite, barite, opal, magnetite, maghemite, goethite, lepidocrocite, ferrihydrite, amorphous ferrihydrites, ilmenite, amorphous ilmenite, todorokite, birnessite, pyrite, hydrotroilite, sphalerite, wurtzite, and galena.

Displacement Reaction

The displacement reaction may be a reaction between the reactant compound in the shaped nanoscale-to-microscale template and a gas, a liquid, a solid, a gas mixture, a liquid solution, or a solid solution.

The displacement reaction may be a displacement of the following type:

$$yA + aM_xN_z => yAN_{za/y} + axM \qquad (2)$$

where A is a reactant, $M_xN_z$ is the reactant compound that comprises all or part of the nanoscale-to-microscale template, $AN_{za/y}$ is a condensed reaction product that is a solid compound, a solid solution, or a solid mixture, M is a second reaction product, and wherein y, a, x, z, za/y, and ax are stoichiometric coefficients. The reactant A may be a gas, a liquid, a solid, a component of a gas mixture, a compound of a liquid solution, or a component of a solid solution.

The displacement reaction may be an oxidation-reduction reaction.

The displacement reaction may be an oxidation-reduction reaction of the following type:

$$yA + aM_xO_z => yAO_{za/y} + axM \qquad (3)$$

where A is a reactant, $M_xO_z$ is a reactant oxide compound that comprises all or part of the nanoscale-to-microscale template, $AO_{za/y}$ is a condensed oxide reaction product that is a solid compound, a solid solution, or a solid mixture, M is a second reaction product, and wherein y, a, x, z, za/y, and ax are stoichiometric coefficients. The reactant A may be a gas, a liquid, a solid, a component of a gas mixture, a compound of a liquid solution, or a component of a solid solution. An example of reaction (3) is:

$$2Mg(g) + SiO_2(s) => 2MgO(s) + Si(s) \qquad (4)$$

Another example of reaction (3) is:

$$4Mg(g) + Co_2SiO_4(s) => 4MgO(s) + CO_2Si(s) \qquad (5)$$

Selective Product Phase Removal

Preferably, at least one of the condensed phase reaction products is completely or partially selectively removed from the reacted nanoscale-to-microscale template. Such selective removal could be conducted, for example, by selective dissolution, selective evaporation, selective reaction, selective disintegration, selective melting, or some combination thereof.

For example, the MgO(s) product in reaction (4) could be selectively removed from the reaction product mixture, MgO(s)+Si(s), by selective dissolution of the MgO(s) in a hydrochloric acid solution.

Composition of the Nanoscale-To-Microscale Replica

The nanoscale-to-microscale replica may be comprised of a single element, a mixture of elements, a metallic solid solution, an intermetallic compound, a non-oxide ceramic compound, or a mixture thereof.

The nanoscale-to-microscale replica may be comprised of silicon, a mixture of silicon with other elements, a silicon-bearing solid solution, a silicon-bearing intermetallic compound, a silicon-bearing non-oxide ceramic compound (such as silicon carbide or silicon nitride), or a mixture thereof.

The nanoscale-to-microscale replica may be comprised of titanium, a mixture of titanium with other elements, a titanium-bearing solid solution, a titanium-bearing intermetallic compound, a titanium-bearing non-oxide ceramic compound (such as titanium carbide or titanium boride or titanium nitride), or a mixture thereof.

The nanoscale-to-microscale replica may be comprised of zirconium, a mixture of zirconium with other elements, a zirconium-bearing solid solution, a zirconium-bearing intermetallic compound, a zirconium-bearing non-oxide ceramic compound (such as zirconium carbide or zirconium boride or zirconium nitride), or a mixture thereof.

The nanoscale-to-microscale replica may be comprised of chromium, a mixture of chromium with other elements, a chromium-bearing solid solution, a chromium-bearing intermetallic compound, a chromium-bearing non-oxide ceramic compound (such as iron carbide), or a mixture thereof.

The nanoscale-to-microscale replica may be comprised of iron, a mixture of iron with other elements, an iron-bearing solid solution, an iron-bearing intermetallic compound, an iron-bearing non-oxide ceramic compound (such as iron carbide), or a mixture thereof.

The nanoscale-to-microscale replica may be comprised of nickel, a mixture of nickel with other elements, a nickel-bearing solid solution, a nickel-bearing intermetallic compound, a nickel-bearing non-oxide ceramic compound, or a mixture thereof.

The nanoscale-to-microscale replica may be comprised of cobalt, a mixture of cobalt with other elements, a cobalt-bearing solid solution, a cobalt-bearing intermetallic compound, a cobalt-bearing non-oxide ceramic compound, or a mixture thereof.

The nanoscale-to-microscale replica may be comprised of copper, a mixture of copper with other elements, a copper-bearing solid solution, a copper-bearing intermetallic compound, a copper-bearing non-oxide ceramic compound, or a mixture thereof.

The nanoscale-to-microscale replica may be comprised of aluminum, a mixture of aluminum with other elements, an aluminum-bearing solid solution, an aluminum-bearing intermetallic compound, an aluminum-bearing non-oxide ceramic compound, or a mixture thereof.

The nanoscale-to-microscale replica may be comprised of manganese, a mixture of manganese with other elements, an manganese-bearing solid solution, an manganese-bearing intermetallic compound, a manganese-bearing non-oxide ceramic compound, or a mixture thereof.

The nanoscale-to-microscale replica may be comprised of molybdenum, a mixture of molybdenum with other elements, an molybdenum-bearing solid solution, an molybdenum-bearing intermetallic compound, a molybdenum-bearing non-oxide ceramic compound, or a mixture thereof.

The nanoscale-to-microscale replica may be comprised of tungsten, a mixture of tungsten with other elements, an tungsten-bearing solid solution, an tungsten-bearing intermetallic compound, a tungsten-bearing non-oxide ceramic compound, or a mixture thereof.

The nanoscale-to-microscale replica may be comprised of hafnium, a mixture of hafnium with other elements, an hafnium-bearing solid solution, an hafnium-bearing intermetallic compound, a hafnium-bearing non-oxide ceramic compound, or a mixture thereof.

The nanoscale-to-microscale replica may be comprised of tantalum, a mixture of tantalum with other elements, an tantalum-bearing solid solution, an tantalum-bearing intermetallic compound, a tantalum-bearing non-oxide ceramic compound, or a mixture thereof.

The nanoscale-to-microscale replica may be comprised of yttrium, a mixture of yttrium with other elements, an yttrium-bearing solid solution, an yttrium-bearing intermetallic compound, a yttrium-bearing non-oxide ceramic compound, or a mixture thereof.

The nanoscale-to-microscale replica may be comprised of lanthanum, a mixture of lanthanum with other elements, an lanthanum-bearing solid solution, an lanthanum-bearing intermetallic compound, a lanthanum-bearing non-oxide ceramic compound, or a mixture thereof.

Further Reaction of the Nanoscale-To-Microscale Replica

The nanoscale-to-microscale replica may undergo further reaction to form a new element, a new mixture of elements, a new metallic solid solution, a new intermetallic compound, a new non-oxide compound, or a mixture thereof.

The further reaction may be a displacement reaction.

The further reaction may be a metathetic displacement reaction of the following type:

$$aA_bY_c + M_dX_e => aA_bX_{e/a} + M_dY_{ca} \quad (6)$$

where $A_bY_c$ is a reactant, $M_dX_e$ is the at least one remaining reaction product present in the replica, $A_bX_{e/a}$ is a solid reaction product that is a solid compound, a solid solution, or a solid mixture, $M_dY_{ca}$ is a second reaction product, and wherein a, b, c, d, e, e/a, and ca are stoichiometric coefficients.

The further reaction may be an additive reaction of the following type:

$$aA_bY_c + M_dX_e => aA_bY_cM_{d/a}X_{e/a} \quad (7)$$

where $A_bY_c$ is a reactant, $M_dX_e$ is the at least one remaining reaction product present in the replica, $A_bY_cM_{d/a}X_{e/a}$ is a solid reaction product that is a solid compound, a solid solution, or a solid mixture prior to the step of attaching one or more precipitation-inducing biological agents to the template. Examples of reaction (7) include:

$$Si(s) + C(s) => SiC(s) \quad (8)$$

$$Si(s) + CH_4(g) => SiC(s) + 2H_2(g) \quad (9)$$

$$3Si(s) + 2N_2(g) => Si_3N_4(s) \quad (10)$$

$$3Si(s) + 4NH_3(g) => Si_3N_4(s) + 6H_2(g) \quad (11)$$

EXAMPLES

Conversion of Diatom Microshells into Silicon Replicas

Cylindrical $SiO_2$-based *Aulacoseira* diatom microshells were utilized as three-dimensional nanostructured microtemplates. Secondary electron images of the starting *Aulacoseira* diatom microshells are shown in FIG. 1. Half of an *Aulacoseira* microshell is shown in FIG. 1A, and a complete microshell is shown in FIG. 1B. The exposed end of the half microshell in FIG. 1A possesses a circular hole and a protruding rim. The other end contains fingerlike extensions and is closed. Rows of fine pores running parallel to the length of the cylindrical microshells can be seen in both FIGS. 1A and 1B.

The *Aulacoseira* diatom microshells were sealed along with solid magnesium within a steel tube. The microshells and magnesium within the sealed steel tube were then heated to 900° C. for 1.5 hours to allow for evaporation of the magnesium and reactive conversion of the diatom microshells into replicas, comprised of MgO and Si, via the oxidation-reduction reaction:

$$2Mg(g) + SiO_2(s) => 2MgO(s) + Si(s) \quad (12)$$

Figure 2:
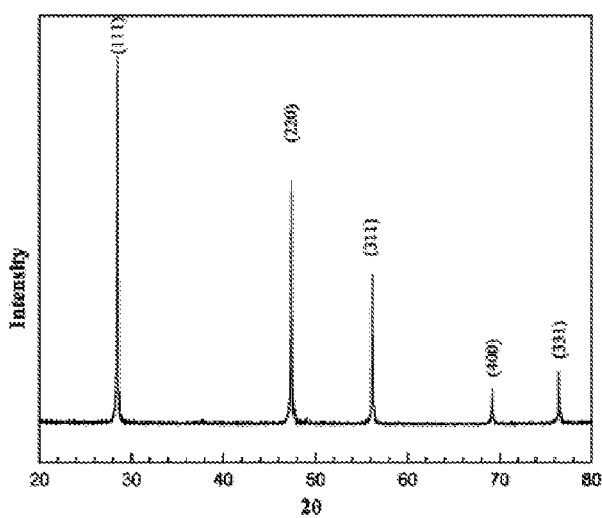
FIG. 2 is an X-ray diffraction pattern obtained from *Aulacoseira* diatom frustules after reaction with Mg(g) for 1.5 hours at 900° C. and then exposure to a hydrochloric acid solution at room temperature for four hours, wherein only diffraction peaks for elemental silicon were detected.

The MgO product in the replicas was then selectively dissolved in a hydrochloric acid solution for four hours at room temperature. An X-ray diffraction pattern obtained from the replicas after such acid dissolution is shown in FIG. 2. Diffraction peaks for only elemental silicon were detected, which confirmed that the MgO had been completely removed by selective dissolution.

Figure 3:
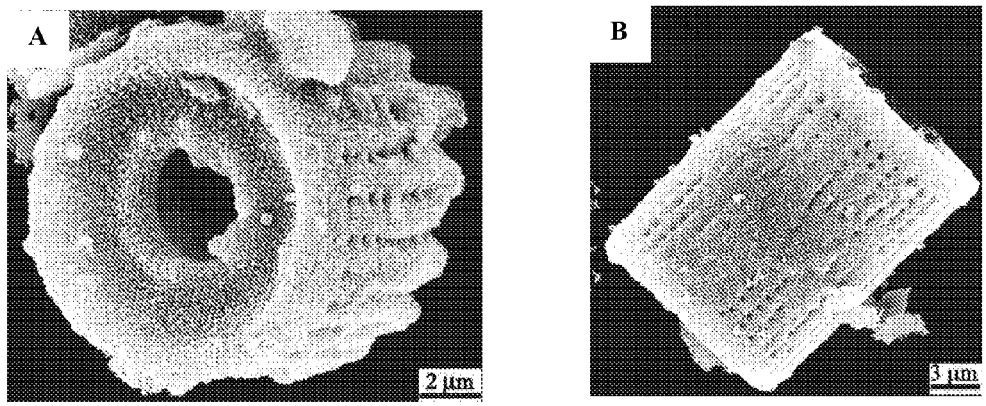

Secondary electron images of these Si replicas are shown in FIGS. 3A and 3B. Although more granular in appearance, the Si replicas retained the three-dimensional cylindrical shape and the fine features of the starting *Aulacoseira* microshells. Comparison of FIGS. 2A and 3A indicates that the protruding rim and circular hole at one end of the half microshell, and the protruding fingers at the other end, were preserved in the Si replica of the half microshell. Comparison of FIGS. 2B and 3B indicates that the cylinder shape, and rows of fine pores running along the cylinder length, were preserved in the Si replica of the full microshell.

Figure 4:
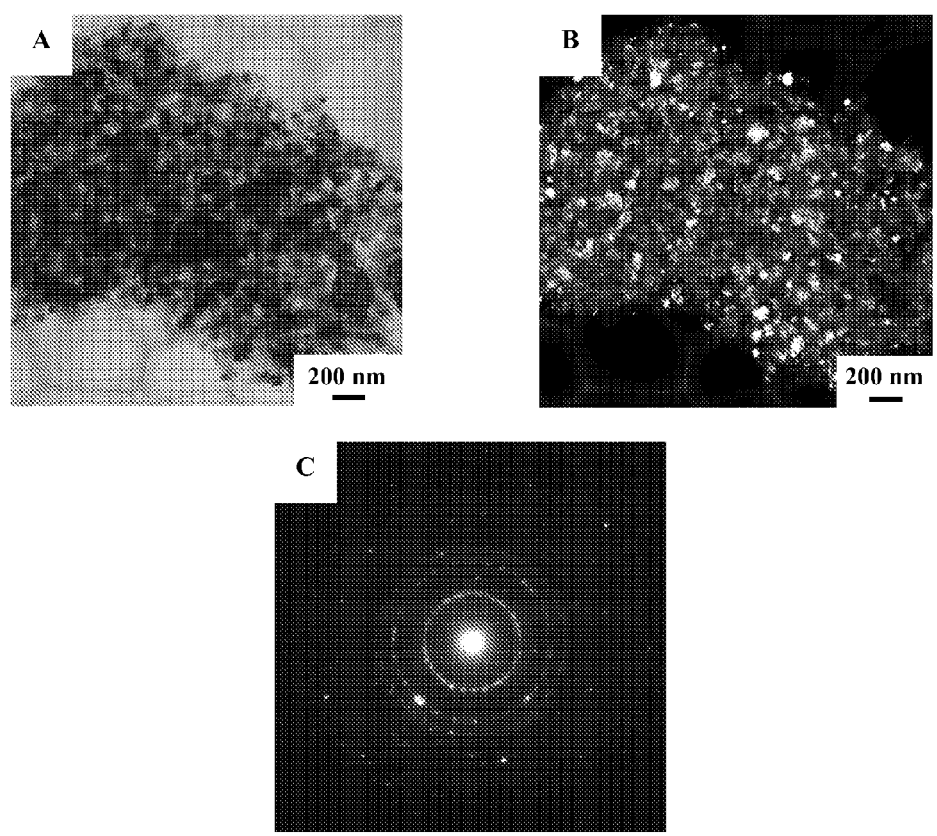
FIGS. 4A-4B are transmission electron images of a cross-section of a silicon replica of *Aulacoseira* microshells.
FIG. 4C is an electron diffraction pattern obtained from the cross-section of FIGS. 4A and 4B (consistent with elemental silicon).

Transmission electron images of a cross-section of a silicon replica are shown in FIGS. 4A and 4B. An electron diffraction pattern obtained from this cross-section is shown in FIG. 4C. This electron diffraction pattern was consistent with elemental silicon (as expected from the x-ray diffraction pattern in FIG. 2). The images in FIGS. 4A and 4B indicate that the silicon crystals within the replicas were quite fine (i.e., on the order of 50 nm or smaller in size).

This example demonstrates that nanostructured, nanocrystalline silicon-based (Si-based) replicas of three-dimensional biologically-derived nanostructured $SiO_2$ microtemplates (diatom microshells) may be produced by the reactive conversion of the microtemplates into replicas of MgO and Si (via an oxidation-reduction displacement reaction) and then selective removal of the MgO (via selective dissolution in a hydrochloric acid solution).

Conversion of Diatom Microshells into Silicon Carbide-Bearing Replicas

In this example, cylindrical $SiO_2$-based *Aulacoseira* diatom microshells (of the type shown in FIGS. 1A and 1B) were again utilized as three-dimensional nanostructured microtemplates. The approach discussed in the previous example was used to convert the microshells into silicon replicas. The silicon replicas were then immersed in a solution, comprised of 10 volume % of a thermosetting phenol-formaldehyde resin (SP-6877, Schenectady International, Inc., Schenectady, N.Y.) dissolved in acetone, for 30 minutes at room temperature. After filtration from the solution and drying in air for 1.5 hours, the frustules were heated in a flowing argon atmosphere at 10° C./min to 1400° C. Upon reaching 1400° C., the heating was stopped and the specimens were allowed to cool to room temperature.

Figure 5:
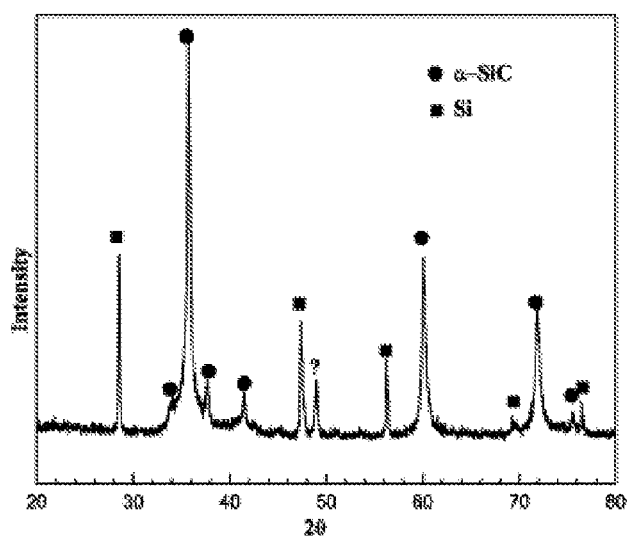
FIG. 5 is an X-ray diffraction pattern obtained from silicon replicas after coating with a phenolic resin and then firing in argon at 1400° C., wherein predominant diffraction peaks for SiC confirmed that the Si replica had reacted with the C generated from the resin coating to yield SiC.

An X-ray diffraction pattern obtained from the microshells after this coating and heat treatment procedure is shown in FIG. 5. Predominant diffraction peaks for SiC were detected, along with some peaks for residual, unreacted Si. This diffraction pattern confirmed that the Si replicas could be converted into SiC via this coating and thermal treatment process.

Figure 6:
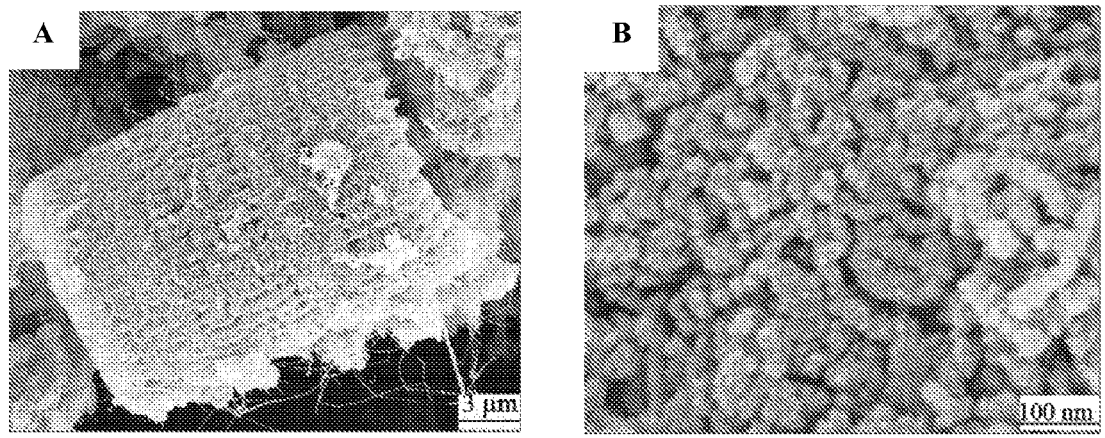
FIGS. 6A-6B are secondary electron images of SiC-bearing replicas of *Aulacoseira* diatom microshells.

Secondary electron images of a SiC-bearing microshell replica are shown in FIG. 6. The lower magnification image in FIG. 6A indicates that the SiC-bearing microshell retained the cylindrical shape and fine features (rows of fine pores, protruding rim at end) of the starting *Aulacoseira* microshell. The higher magnification image in FIG. 6B of the surface of the SiC-bearing microshell replica reveals fine (nanocrystalline) SiC grains.

This example demonstrates that nanostructured, nanocrystalline silicon carbide (SiC)-bearing replicas (i.e., non-oxide silicon compound replicas) of three-dimensional biologically-derived nanostructured $SiO_2$ microtemplates (diatom microshells) may be produced by the reactive conversion of the microtemplates into replicas of MgO and Si (via an oxidation-reduction displacement reaction), the selective removal of the MgO (via selective dissolution in a hydrochloric acid solution), and then further reaction of the resulting Si replica with C (via coating of the Si replica with a phenolic resin and then firing in argon at 1400° C.).

Figure 7:
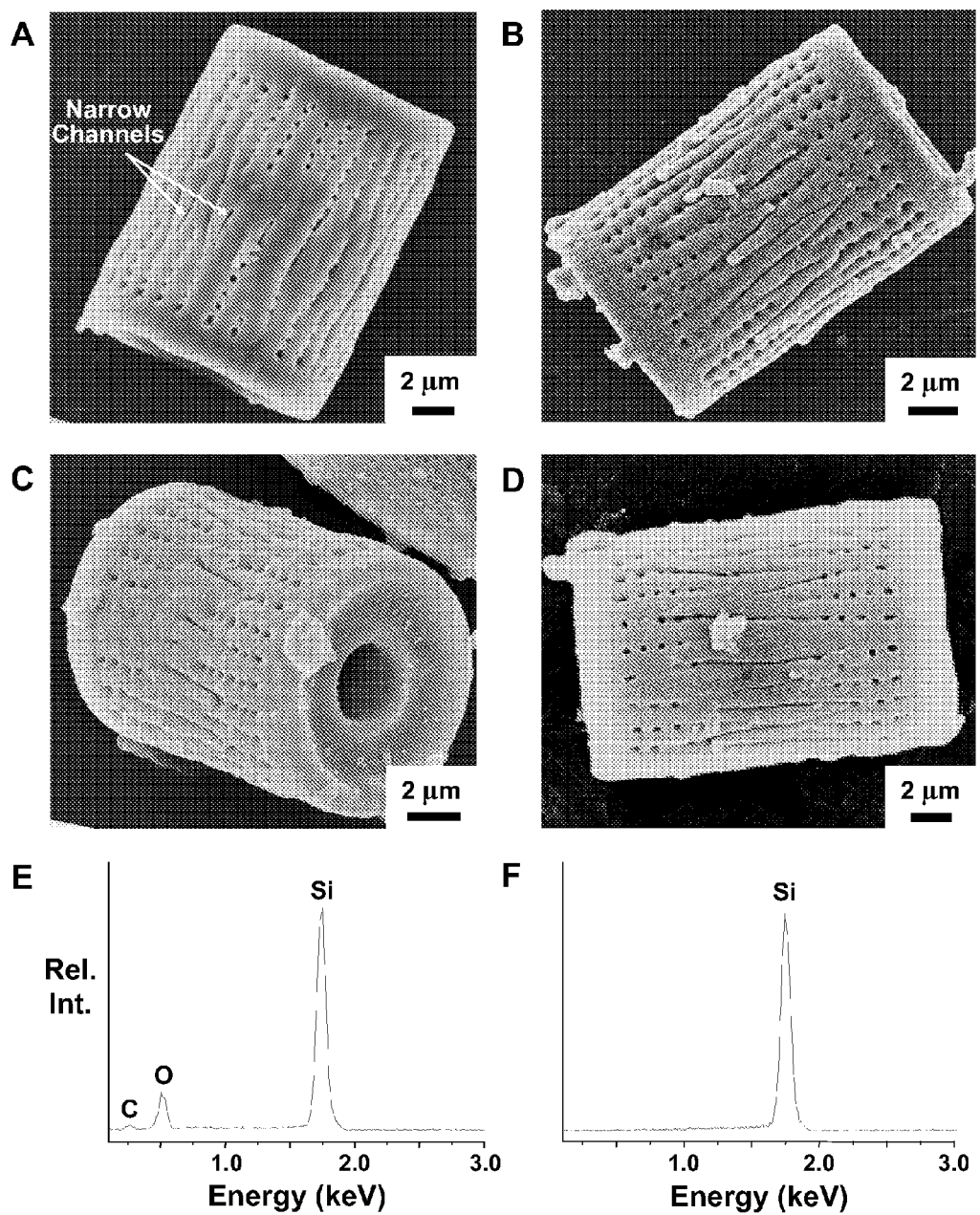
FIGS. 7A-7D illustrate shape-preserving magnesiothermic reduction of silica diatom frustules.
FIGS. 7E and 7F—Energy dispersive X-ray analyses obtained from Si frustule replicas of the type shown in FIG. 7C and FIG. 7D, respectively.

Chemical Reduction of Three-Dimensional Silica Micro-Assemblies into Microporous Silicon Replicas $SiO_2$ diatom frustules were converted into MgO/Si-bearing replicas by reaction (4). Images of a $SiO_2$ *Aulacoseira* diatom frustule, and of a reacted MgO/Si-bearing product, are shown in FIGS. 7A and 7B, respectively. The *Aulacoseira* frustules possessed a hollow cylindrical shape. End faces of the frustules contained a circular hole with a protruding outer rim. These frustules were lined with rows of fine pores (102 nm diameter) running along the cylinder length, and also contained narrow channels between intercalating finger-like extensions.

The MgO/Si composites (FIG. 7B) generated by reaction (4) retained the three-dimensional cylindrical morphology and nanoscale features (rows of fine pores, narrow channels) of the *Aulacoseira* frustules. X-ray diffraction analysis (FIG. 8A) confirmed the presence of MgO and Si in the reacted specimens. The MgO/Si composite replicas were then immersed in a 1M HCl solution for four hours.

X-ray diffraction (FIG. 8B) and energy dispersive X-ray (FIG. 7E) analyses indicated that this treatment resulted in the selective and complete dissolution of magnesia. The resulting silicon-based product (FIG. 7C) retained the three-dimensional morphology and nanoscale features of the *Aulacoseira* frustules. The energy dispersive X-ray pattern in FIG. 7E contained a modest oxygen peak, which was associated with amorphous silica formed during exposure of the silicon to the water-rich HCl solution. The replicas were then immersed in an ethanol-based HF solution for 20 minutes.

The absence of an oxygen peak in the energy dispersive X-ray pattern in FIG. 7F indicated that the silica had been completely and selectively dissolved by this HF treatment. X-ray photoelectron spectroscopy also confirmed the absence of silica in the specimens after the HF treatment. The replicas exposed to this HF treatment (FIG. 7D) retained the shape and fine features of the starting frustules.

A mixture of one mole of silicon with two moles of magnesia (the products of reaction (4)) corresponds to 34.9 volume % silicon and 65.1 volume % magnesia. A uniform distribution of silicon and magnesia in such a product mixture should consist of co-continuous, interpenetrating silicon and magnesia phases. The interconnectivity of both phases enabled the magnesia to be completely dissolved from the MgO/Si frustule replicas, and the remaining silicon to be retained as a highly porous, but interconnected structure that preserved the starting frustule morphology.

Nitrogen adsorption (BET) measurements indicated that the specific surface areas of the starting silica frustules and of the MgO/Si composite replicas were only 1.65 m$^2$/g, and 1.56 m$^2$/g, respectively. After magnesia removal, however, the specific surface area increased to 541 m$^2$/g. BJH analyses of the nitrogen desorption curves indicated that, unlike the starting frustules or MgO/Si replicas, the silicon replicas possessed a significant population of micropores; that is, pores $\leq$2 nm in diameter comprised 30% of the cumulative volume occupied by all pores $\leq$125 nm in diameter.

The use of magnesium gas as a reducing agent enabled the reduction process to be conducted at a modest temperature, where the formation of volatile silicon-bearing gas species (e.g., SiO(g), Si(g)) was suppressed. As a result, the reduction reaction could be completed on and within the frustules (and not within the gas phase away from the frustule surfaces) to yield MgO/Si-bearing replicas. The modest 650° C./2.5 hour heat treatment, along with the formation of a continuous refractory MgO phase intertwined with the Si product, inhibited substantial coarsening and sintering of the Si product, so that features as fine as a few tens of nm in the starting silica diatom frustules could be preserved in the silicon replicas after selective magnesia dissolution.

Transmission electron images of cross-sections of a Si frustule replica are shown in FIGS. 9A-9D. A corresponding selected area electron diffraction (SAED) pattern is shown in FIG. 9E. Consistent with X-ray diffraction analysis (FIG. 8B), SAED analyses indicated the presence of silicon as the only crystalline phase throughout the replica cross-section.

Figure 8:
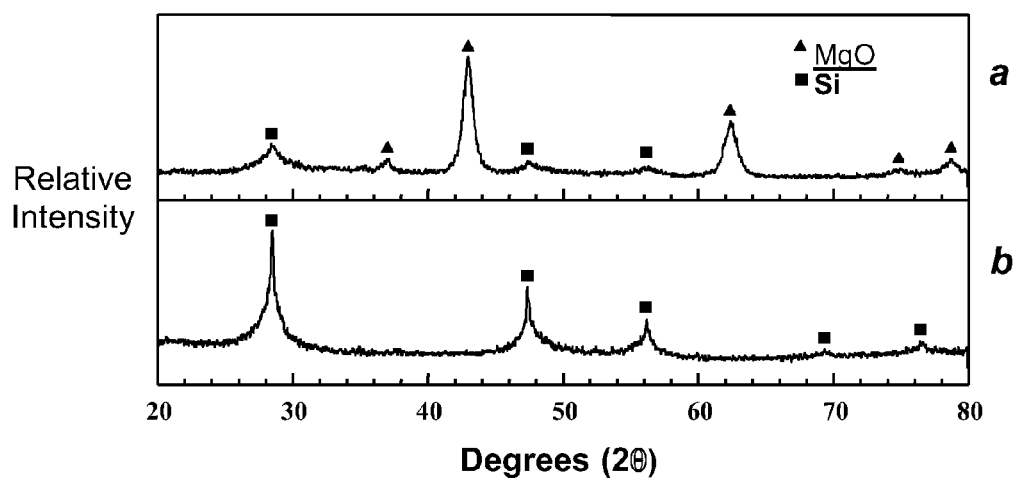

The fine sizes of the silicon crystals (FIG. 9B) detected within the wall of the converted frustule were also consistent with Scherrer analysis of the X-ray diffraction pattern in FIG. 8B, which yielded an average silicon crystallite size of 13±2 nm.

Figure 9:
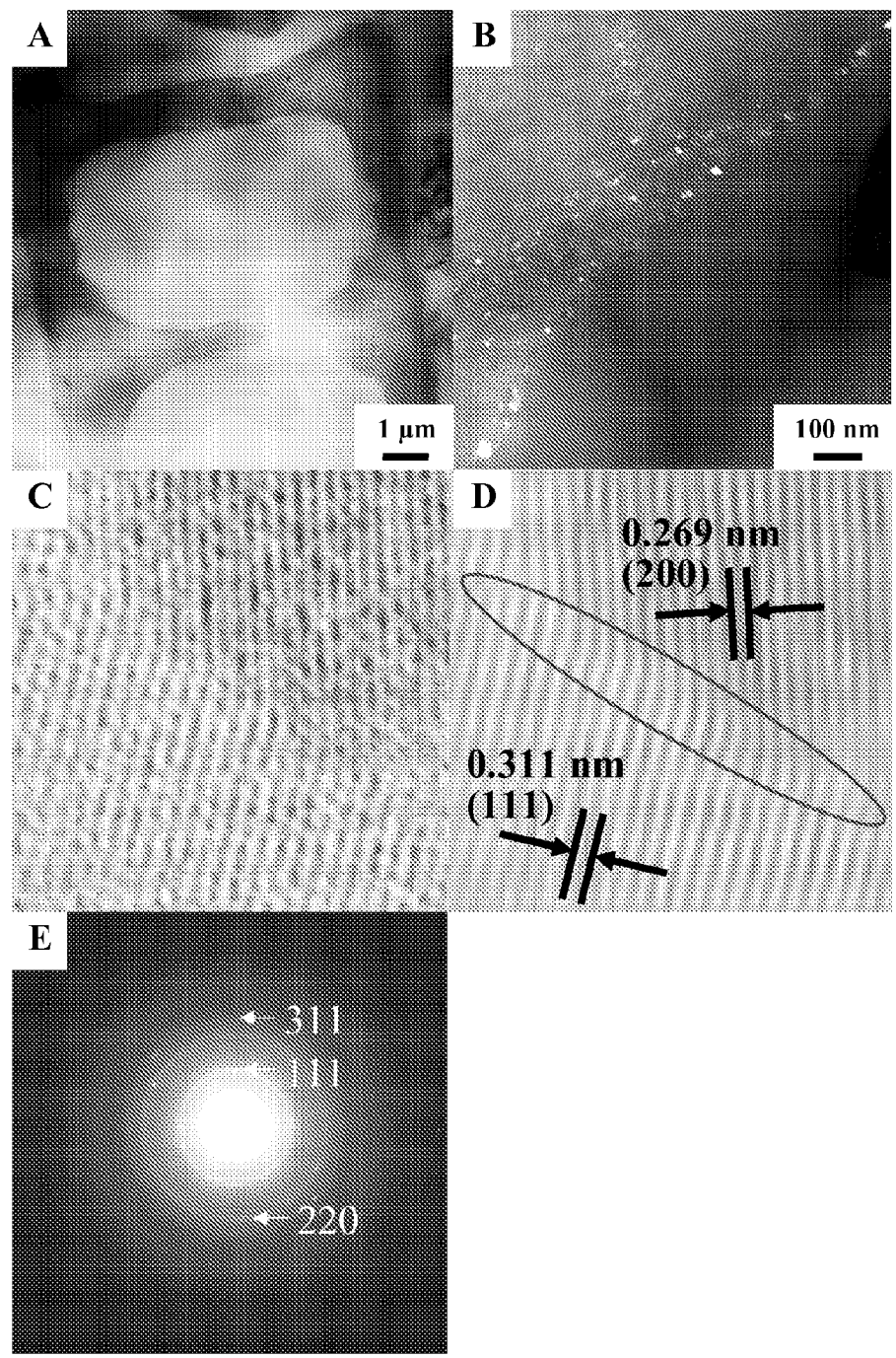
FIGS. 9A-9E illustrate fine scale structure of Si replicas produced by magnesiothermic reduction of *Aulacoseira* diatom frustules.

The high resolution transmission electron image shown in FIG. 9C, and the associated Fourier filtered version of this image in FIG. 9D, reveal lattice fringe images of adjacent silicon nanocrystals. The continuation of the lattice fringe patterns from these adjacent grains up to the grain boundary indicated that this grain boundary was free of an amorphous silica phase. Grain boundaries between other adjacent silicon nanocrystals were also found to be free of an amorphous phase. Some of the silicon crystals located at the outer surfaces of the silicon replicas were relatively large (~30 nm, FIG. 9B). A modified protocol was used to further reduce the average size of the crystals in the silicon replicas.

The MgO/Si composite replicas were immersed in an aqueous solution of 1.1 M hydrogen peroxide and 2.2 M ammonium hydroxide at 70° C. for 0.5 hour to partially oxidize the silicon grains (particularly the relatively coarse grains on the external replica surfaces). The specimens were then immersed in hydrofluoric acid and hydrochloric acid solutions to selectively dissolve the silica and magnesia, respectively. Scherrer analysis of the X-ray diffraction pattern obtained from such silicon replicas yielded a reduced average silicon crystallite size of 8±1 nm.

Figure 10:
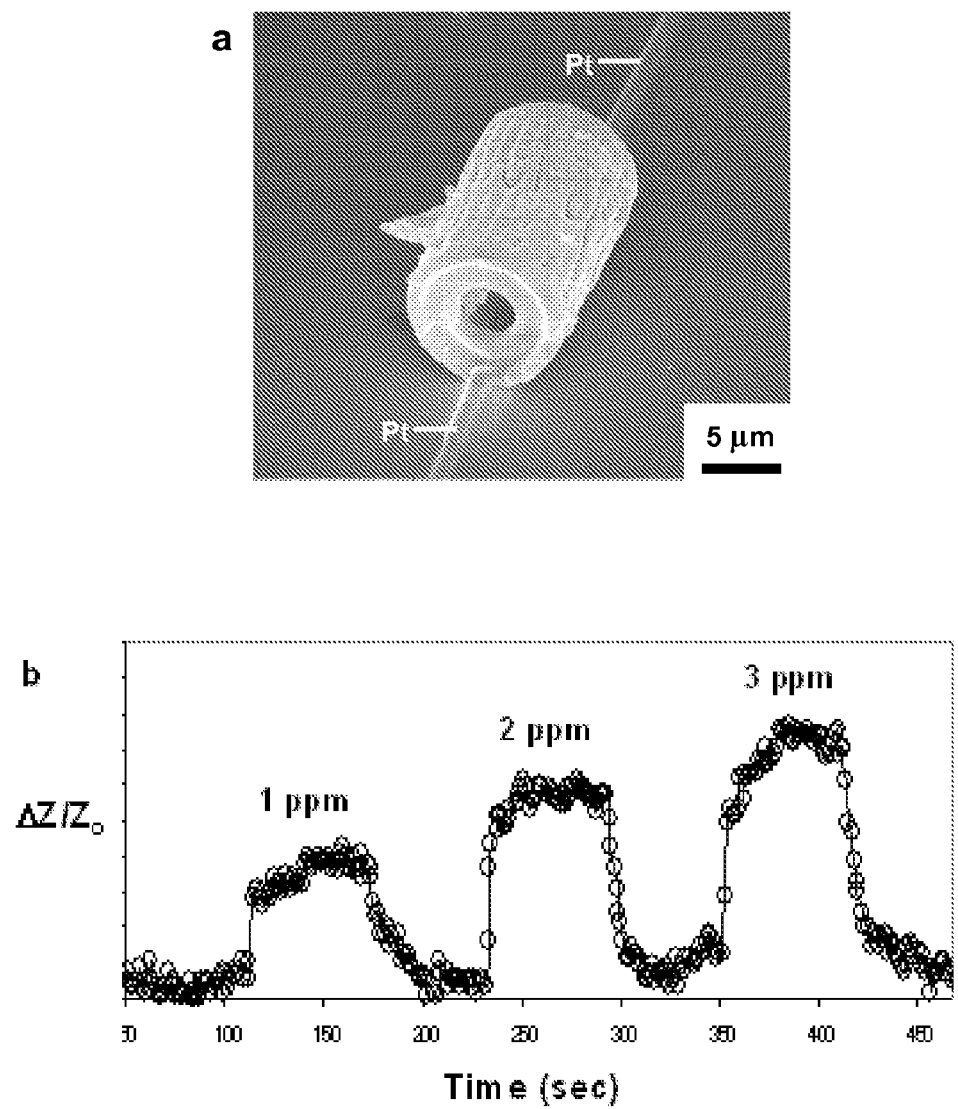
FIG. 10A illustrates a secondary electron image of an electroded microporous Si frustule replica.
FIG. 10B is an electrical response of this single silicon frustule sensor to NO(g). ΔZ is the impedance change upon exposure to NO(g), and $Z_o$ is the sensor impedance in pure flowing argon. Measurements were obtained every second.

Planar, two-dimensional microporous silicon has been used as a sensor of various gas species. The high specific surface areas and open (accessible) structures of the present three-dimensional silicon frustule replicas are attractive characteristics for sensitive and rapid gas detection. To evaluate such gas detection, a simple sensor based on a Si frustule replica was fabricated (FIG. 10A). Platinum electrodes were used to connect the ends of this replica to gold pads (not shown) deposited on a silicon nitride substrate. A modest bias voltage (100 mV at 100 Hz) was applied across the electroded Si frustule replica, and the change in impedance was evaluated upon exposure to flowing NO(g) in an Ar(g) carrier stream at 300° C.

The impedance of the Si frustule sensor increased upon exposure to low (ppm) concentrations of NO(g) (FIG. 10B). Furthermore, changes of only 1 ppm in NO(g) concentration could be detected. The response (rise) and recovery (decay) times of this sensor were about 6 seconds and 25 seconds, respectively, which are faster than has been reported for planar porous silicon sensors exposed to comparable NO(g) concentrations. Such a combination of rapid ($\leqq 25$ seconds) and sensitive (1 ppm) detection of NO(g) from a microscale (minimally-invasive) three-dimensional Si sensor operating with a bias voltage of only 100 mV (instead of several volts) has not previously been achieved. The high sensitivity and rapid response rate of the silicon frustule replica demonstrate the benefits of such an open, porous, high surface area, three-dimensional structure.

The photoluminescence of microporous silicon in ultraviolet light has been reported, particularly after partial oxidation in water. To evaluate such photoluminescence, the silicon frustule replicas were partially oxidized by immersion in water for 40 days. The photoluminescence of the three-dimensional silicon frustule replicas was dramatically enhanced after such partial oxidation.

It is thus demonstrated that microporous assemblies of silicon nanocrystals with intricate and well-controlled three-dimensional morphologies may be synthesized by the shape-preserving magnesiothermic reduction of microscale silica-based structures at only 650° C. Biologically-replicable silica-forming micro-organisms, such as diatoms, can provide a wide variety of intricate three-dimensional silica structures for this reduction process.

Sustained culturing of a given diatom species can yield significant quantities of three-dimensional silica frustules of similar morphology. For example, the diatom biomass production rate of a single pilot scale facility with 45 vertical bubble column photobioreactors can be in excess of 700 kg (dry weight) per annum, which corresponds to an annual silica frustule yield in excess of 70 kg (assuming a modest 10 weight % silica content in the dry cells). The magnesiothermic reduction process is also amenable to scaleup. Hence, by applying the shape-preserving magnesiothermic reduction process to biologically or synthetically self-assembled silica templates, large quantities of three-dimensional silicon nanocrystal assemblies with precisely-controlled microscale shapes and nanoscale features (pores, channels, etc.) may be synthesized for use in sensor, electronic, optical, biochemical, or other applications.

In one experiment, diatom frustules were spread evenly within a steel boat to form a 0.2 mm deep powder bed. The frustule-bearing steel boat and magnesium granules were placed at opposite ends of a steel ampoule that was then welded shut. The $Mg:SiO_2$ molar ratio sealed within each ampoule was 2.5:1 (i.e., in excess of the magnesium required for complete reaction with the gaseous oxygen and nitrogen and the silica frustules within the ampoules). Such ampoules were thrust into a tube furnace that had been preheated to 650° C., and then held at this temperature for 2.5 hours. The reacted frustules were observed to contain three regions of different color. The region located nearest the magnesium gas source possessed a blue color. A black region and then a brown region were observed with increasing distance from the magnesium gas source. X-ray diffraction analyses indicated that each region contained magnesium oxide. The black and brown regions also contained silicon as a secondary product phase, whereas the blue region contained magnesium silicide, $Mg_2Si$.

Residual, unreacted silica (in the form of cristobalite) was detected in the brown region. The MgO/Si composite material located in the black region of the reacted frustule bed was collected and immersed in a 1 M HCl solution (molar HCl:$H_2O$:EtOH ratio=0.66:4.72:8.88) for 4 h at room temperature to selectively dissolve the magnesia. The specimens were then exposed to a HF solution (molar HF:$H_2O$:EtOH ratio=1.05:1.11:6.45) in order to ensure that any silica formed during exposure to the aqueous HCl treatment was removed. The HCl treatment and the subsequent HF treatment were conducted within an Argon atmosphere glove box. The argon in this glove box was obtained from an ultra high purity tank (99.999% purity) and this gas was further scrubbed of oxygen with an oxygen gettering system. The oxygen partial pressure in this glove box was maintained at below 0.1 ppm (as determined by an oxygen sensor).

The infrared spectra for FTIR measurements were recorded using a Bruker Equinox 55 spectrometer with a liquid $N_2$-cooled MCT detector. Measurements were made in diffuse reflectance mode using a Praying Mantis™ DRIFTS attachment from Harrick Scientific. Both the spectrometer and DRIFTS attachment were continuously purged with $N_2$ gas to minimize the background signal from atmospheric $CO_2$ and $H_2O$. The spectra obtained were averages of 128 scans recorded at 4 $cm^{-1}$ resolution. The sample spectra, measured from samples consisting of ~10 volume % silicon frustule replicas mixed with KBr powder, were referenced to a background of pure KBr powder. XPS analyses were conducted with a Kratos Axis-165 instrument (Kratos Analytical Ltd., Manchester, UK) using monochromatic Al Kα radiation. The specimens were transferred into the XPS instrument under an argon atmosphere.

After removal from the HF-bearing solution, the specimens were allowed to dry in the argon atmosphere glove box. The frustule replicas were pressed onto 0.25 mm thick indium foil and then sealed in plastic bags within the glove box. The sealed bags were then placed inside a glove bag that was, in turn, sealed around the evacuable antechamber of the XPS. After the glove bag was purged with ultra high purity (99.999%) argon, the specimens were then removed from the plastic bags and placed inside the antechamber. The antechamber was then evacuated for XPS analyses. Milling of the specimens within the XPS system was conducted with Ar+ ions. XPS analyses were calibrated with respect to the C 1s excitation (285.0 eV).

For gas sensing measurements, a single silicon frustule (*Aulacoseira*) replica was placed on a silicon nitride substrate and platinum electrodes were then applied to both ends of the replica with the aid of a Focused Ion Beam instrument. A potentiostat was used to impose a small bias voltage (100 mV at 100 Hz) across the Si frustule sensor, and to monitor the corresponding current passing through the sensor, as the sample gas was switched from pure argon to argon containing different concentrations of NO(g) at 300° C.

The photoluminescence (PL) spectrum was obtained with a Spex 1000M spectrometer using an argon laser, with an emission wavelength of 275 nm (UV) and a power of 5 mW, as the excitation source. The laser was focused to a spot of ~1 mm in diameter on the sample. The PL measurements were performed at room temperature and recorded with a GaAs photomultiplier tube (PMT) with a cutoff wavelength of 920 nm. Fluorescence microscopy was conducted utilizing a Zeiss Axiovert 200 microscope, with a fluorescence excitation of 450-490 nm.

High Surface Area, Three-Dimensional Negative Electrodes for Lithium Batteries with High Energy and Power Densities Considerable interest exists in the development of three-dimensional electrodes for the next generation of lithium micro-batteries for higher energy and power densities for use in microelectronic and telecommunications devices. Owing to more effective utilization of available volume (i.e., with active surfaces exposed to the electrolyte in all three dimensions for rapid charge and mass transport), such three-dimensional electrodes have the potential for significant improvements in both energy density and power density.

Nanostructured silicon-based materials can be highly attractive for negative electrodes in lithium ion batteries. The electrochemical reaction of silicon with lithium can yield Li—Si compounds with an x value up to 4.4 (for $Li_{22}Si_5$), which allows for an extremely large theoretical specific capacity of 4200 mAh/g. Moreover, Li—Si compounds exhibit low open circuit voltages versus lithium (e.g., ≦0.044 V for $Li_{22}Si_5$ versus Li), and a high Li—Si chemical diffusion coefficient (~$6 \times 10^{-5}$ $cm^2/s$ at 415° C.). As a result, a variety of Si-based materials have been studied for lithium battery applications.

Silicon diatom frustule replicas of the type generated by the present invention are ideally suited as nanostructured three-dimensional negative electrodes for lithium battery applications. First, the high surface areas (>500 $m^2/g$) and thin wall thicknesses of the silicon frustule replicas (<1 μm for *Aulacoseira* frustule replicas) offer high rate capability with minimum interfacial polarization. Second, the open accessible porosity within the frustule replicas not only allows for rapid penetration of the liquid electrolyte (and thus facile transport of lithium ions), but also provides space for the volumetric expansion that occurs as Si uptakes Li to form Si—Li compounds during charging. Third, the nanocrystalline nature of the silicon frustule replicas is attractive from the standpoint of reversible capacity. The three-dimensional silicon frustule replicas of the present invention contain a significant population of very fine pores, and these replicas possess very high surface areas. Owing to the hollow three-dimensional shape of the $SiO_2$ diatom frustules, the Si frustule replicas have readily accessible internal and external surfaces; that is, the electrolyte can quickly gain access to the fine pores from both sides of the thin frustule walls. Hence, the high surface areas, the accessible (open) fine pores within thin walls, the nanocrystalline nature, and the well-controlled (uniform) three-dimensional shapes of the silicon frustule replicas make these particles unique and highly attractive as negative electrode materials for lithium batteries with high energy and power densities.

Perfusive Support Media of High Binding Capacity and High Stiffness for HPLC (I.E., for Rapid Separation/Purification of Biomolecules)

The high surface areas, open fine pores, thin walls, and uniform three-dimensional shapes of the silicon frustule replicas also make these particles very attractive for use as adsorbants, filters, or catalysts for biochemical, biomedical, and chemical applications. One particular application of this type will be discussed in detail here: perfusive support media for high pressure, high performance liquid chromatography (HPLC).

Hollow, porous-wall three-dimensional silicon frustule replicas with controlled and uniform shapes would be very attractive as high capacity, high throughput support media for the rapid separation/purification of biomolecules by high pressure HPLC. The introduction of high pressure HPLC in 1976 has resulted in order-of-magnitude enhancements in the rates of separation and purification of biomolecules (e.g., proteins, DNA) without a loss of resolution or degradation in biomolecule activity. This development, in turn, greatly enhanced the rate of isolation and discovery of new proteins, enzymes, and other macromolecules for biotechnological (biomedical, consumer product) applications. High pressure HPLC was enabled by the use of fine, silica-based (glassy) particles as support media. Because silica-based particles are much stiffer then organic particles, silica-based particle columns could withstand higher pressures without collapsing. The use of finer particles and higher pressures allowed for more rapid convection of the fluid phase through the columns and, in turn, more rapid biomolecule separation. In order to achieve high throughput separation/purification of biomolecules by HPLC, the support media particles should possess a high surface area (to allow for a high surface concentration of binding ligands for a large binding capacity) and a small size (to reduce the diffusion distance of a biomolecule from the outer convective flow stream to the interior of the particle, to reduce the time for attachment to the binding ligands within the particle interior). However, columns comprised of very fine particles tend to possess very fine inter-particle pores that, in turn, require the use of impractically high pressures to push the fluid through the column. An alternative strategy is the use of "perfusion" media. Perfusive particles contain a network of large (e.g., >600 nm) and small (e.g., <100 nm dia.) pores that are interconnected. The network of large (flow-through) pores allows for convective flow of fluid through the particles, so that relatively short distances are required for diffusion through the regions containing the small (diffusion) pores. The use of perfusion media has enhanced the dynamic capacity (mg biomolecule/g absorbent/time) of chromatography. Perfusive media comprised of inorganic particles (i.e., particles with much higher stiffnesses) would allow for much higher pressures and corresponding higher rates of separation/purification.

Silicon diatom frustule replicas of the type generated by the present invention are well-suited for use as perfusive media for very high throughput HPLC. The particles possess high surface areas (>500 m$^2$/g) and a significant population of micropores (i.e., for high binding capacity). The frustule shapes are also ideal for perfusive particles. The frustules are hollow, thin walled (e.g., <1 µm thickness for *Aulacoseira* frustules), and contain macropores (several hundred nm in dia.) that run completely through the frustule wall. Because the high surface area nanoparticulate-based Si frustule replicas also retain these geometric features, the average diffusion distance to the micropores in the interior of the replica walls is quite short. Furthermore, the morphologies of frustules from a given diatom are the same, which allows for reproducible column packing. The stiffness (elastic modulus) of silicon at room temperature is 160±30 GPa (depending on crystal orientation), which is higher than for amorphous silica (75±20 GPa). Hence, the high surface areas, the accessible (open) fine pores within thin walls, the well-controlled (uniform) hollow three-dimensional shapes, and the high stiffness and demonstrated functionalization of porous silicon, make the silicon frustule replicas unique and highly attractive as perfusive support media for very high throughput HPLC.

In such applications (rapid, sensitive, low voltage gas sensors; three-dimensional negative electrodes for high energy and power density lithium batteries; high binding capacity, stiff perfusive support media for high throughput HPLC), the nanocrystallinity, microporosity, high surface area, hollow (thin walled) geometry, shape uniformity, and chemical or electrical properties of the three-dimensional silicon frustule replicas make such structures very attractive for such high performance devices. These structural and chemical characteristics can also be attractive for other optical and biochemical devices, including:

Three-dimensional diodes for betavoltaic (tritium-powered) or photovoltaic (solar) cells The gas phase doping of planar porous silicon, to generate p/n junctions, has yielded diodes with enhanced betavoltaic and photovoltaic performance (relative to planar, nonporous p/n silicon diodes). With appropriate gas phase p/n doping, the higher surface area three-dimensional silicon frustule replicas could be quite attractive for such solar or tritium-powered cells.

Three-dimensional substrates for cell culturing and tissue engineering

It is known to utilize planar porous silicon (generated by anodization in HF-bearing solutions) substrates as biocompatible templates for the culturing of viable neuronal and vertebrate cells, hepatocytes (liver cells), and Chinese hamster ovary cells. It is also known that cell culturing on three-dimensional templates can result in significant enhancements in cell activity. The ability to synthesize porous silicon replicas with diatom frustule shapes and fine features allows for a wide variety of three-dimensional silicon morphologies to be evaluated as scaffold templates (e.g., three-dimensional silicon frustule replicas could be compacted into macroscopic disks for use as scaffolds).

The magnesiothermic reduction process of the present invention can also be applied to synthetic three-dimensional $SiO_2$ preforms with non-natural structures, such as have been produced by scalable processes including various approaches for colloidal assembly (e.g., natural sedimentation, solvent evaporation-mediated, entropically-driven, with micropatterned templates), laser-assisted micropatterning of silica, and direct ink writing. Microporous silicon replicas of such synthetic silica preforms can be also be attractive for the applications mentioned above.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A method for the production of a shaped nanoscale-to-microscale structure comprising:

providing a nanoscale-to-microscale template having an original chemical composition and an original shape;

subjecting said nanoscale-to-microscale template to at least a first chemical reaction that yields a first reaction product comprising at least one condensed oxide compound and a second reaction product selected from the group consisting of a metallic element, a mixture of metallic elements, a metallic solid solution, an intermetallic compound, a non-oxide ceramic compound and mixtures thereof, so as to partially or completely convert the nanoscale-to-microscale template into the shaped nanoscale-to-microscale structure having a chemical composition different than the original chemical composition and having substantially the same shape as the original shape; and selectively removing at least a portion of the condensed oxide compound to yield a shaped nanoscale-to-microscale structure having substantially the same shape as the original shape and comprising the second reaction product.

2. The method of claim 1, wherein the shape of the nanoscale-to-microscale structure is a scaled version of the original shape of the nanoscale-to-microscale template.

3. The method of claim 1, wherein the nanoscale-to-microscale template is a biologically-derived nanoscale-to-microscale template.

4. The method of claim 1, wherein the nanoscale-to-microscale template is a synthetically-derived nanoscale-to-microscale template.

5. The method of claim 3, wherein the biologically-derived nanoscale-to-microscale template is a shaped biologically-derived mineral article.

6. The method of claim 1, wherein the nanoscale-to-microscale template comprises a reactant compound, and wherein the at least a first chemical reaction is a displacement reaction that yields at least two condensed phase reaction products.

7. The method of claim 6, wherein the displacement reaction is of the following type:

$$yA + aM_xN_z => yAN_{za/y} + axM$$

where A is a reactant, $M_xN_z$ is the reactant compound that comprises all or part of the nanoscale-to-microscale template, $AN_{za/y}$ is the first reaction product that is a solid compound, a solid solution, or a solid mixture, M is a second reaction product, and wherein y, a, x, z, za/y, and ax are stoichiometric coefficients.

8. The method of claim 6, wherein the displacement reaction is an oxidation-reduction reaction of the following type:

$$yA + aM_xO_z => yAO_{za/y} + axM$$

where A is a reactant, $M_xO_z$ is a reactant oxide compound that comprises all or part of the nanoscale-to-microscale template, $AO_{za/y}$ is the first reaction product that is a solid compound, a solid solution, or a solid mixture, M is a second reaction product, and wherein y, a, x, z, za/y, and ax are stoichiometric coefficients.

9. The method of claim 1, wherein the nanoscale-to-microscale template undergoes at least a second chemical reaction, wherein upon subjecting said nanoscale-to-microscale template to the at least first chemical reaction and selectively removing at least a portion of the condensed oxide compound, an intermediate template comprising the second reaction product is formed and wherein upon subjecting the intermediate template to the at least second chemical reaction, the shaped nanoscale-to-microscale structure comprises a new second reaction product selected from the group consisting of a new metallic element, a new mixture of metallic elements, a new metallic solid solution, a new intermetallic compound, a new non-oxide ceramic compound and mixtures thereof, the second reaction product formed from the first chemical reaction having a different chemical composition than the new second reaction product formed from the second chemical reaction.

10. The method of claim 9, wherein the at least second chemical reaction is a displacement reaction.

11. The method of claim 9, wherein the at least a second chemical reaction is a metathetic displacement reaction of the following type:

$$aA_bY_c + M_dX_e => aA_bX_{e/a} + M_dY_{ca}$$

where $A_bY_c$ is a reactant, $M_dX_e$ is the at least one remaining second reaction product present in the nanoscale-to-microscale template, $A_bX_{e/a}$ is a new second reaction product, $M_dY_{ca}$ is a another reaction product, and wherein a, b, c, d, e, e/a, and ca are stoichiometric coefficients.

12. The method of claim 9, wherein the at least a second chemical reaction is an additive reaction of the following type:

$$aA_bY_c + M_dX_e => aA_bY_cM_{d/a}X_{e/a}$$

where $A_bY_c$ is a reactant, $M_dX_e$ is the at least one remaining second reaction product present in the nanoscale-to-microscale template, $A_bY_cM_{d/a}X_{e/a}$ is a new second reaction product.

13. The method of claim 12, wherein $A_bY_cM_{d/a}X_{e/a}$ is selected from the group consisting of silicon carbide and silicon nitride.

14. The method of claim 1, wherein the original composition is $SiO_2$, wherein the first chemical reaction product comprising MgO, and the second reaction product comprising of Si.

* * * * *